(12) United States Patent
Miura et al.

(10) Patent No.: US 9,391,229 B2
(45) Date of Patent: Jul. 12, 2016

(54) LIGHT RECEIVING ELEMENT, SEMICONDUCTOR EPITAXIAL WAFER, DETECTING DEVICE, AND METHOD FOR MANUFACTURING LIGHT RECEIVING ELEMENT

(71) Applicant: Sumitomo Electric Industries, Ltd., Osaka-shi (JP)

(72) Inventors: Kohei Miura, Osaka (JP); Hiroshi Inada, Yokohama (JP); Yasuhiro Iguchi, Osaka (JP); Tadashi Saito, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/347,581

(22) PCT Filed: May 16, 2013

(86) PCT No.: PCT/JP2013/063668
§ 371 (c)(1),
(2) Date: Mar. 26, 2014

(87) PCT Pub. No.: WO2013/179901
PCT Pub. Date: Dec. 5, 2013

(65) Prior Publication Data
US 2014/0312304 A1    Oct. 23, 2014

(30) Foreign Application Priority Data

May 30, 2012  (JP) ................................. 2012-123515

(51) Int. Cl.
*H01L 31/18*    (2006.01)
*H01L 27/146*    (2006.01)
(Continued)

(52) U.S. Cl.
CPC .............. *H01L 31/18* (2013.01); *B82Y 20/00* (2013.01); *H01L 21/02392* (2013.01);
(Continued)

(58) Field of Classification Search
CPC ..... H01L 29/06; H01L 21/00; H01L 31/0352; H01L 31/18; H01L 31/0304; H01S 5/00
See application file for complete search history.

(56) References Cited

U.S. PATENT DOCUMENTS

2003/0213950 A1*  11/2003  Hwang ............. H01L 21/76256
                                                         257/18
2005/0040429 A1*   2/2005  Uppal .................... B82Y 20/00
                                                         257/190
(Continued)

FOREIGN PATENT DOCUMENTS

JP    61-239679 A    10/1986
JP    02-254731 A    10/1990
(Continued)

OTHER PUBLICATIONS

A Long-Wavelength Photodiode on InP Using Lattice-Matched GaInAs—GaAsSb Type-II Quantum Wells "IEEE Photonics Technology Letters IEEE USA", hereinafter Sidhu R).*
(Continued)

*Primary Examiner* — Fernando L Toledo
*Assistant Examiner* — Lawrence-Linh T Nguyen
(74) *Attorney, Agent, or Firm* — Venable LLP; Michael A. Sartori; Tamatane J. Aga

(57) ABSTRACT

Provided are a light receiving element etc. which have a high responsivity over the near- to mid-infrared region and stably have a high quality while maintaining the economical efficiency. The light receiving element includes an InP substrate that is transparent to light having a wavelength of 3 to 12 μm, a middle layer that is epitaxially grown on the InP substrate, a GaSb buffer layer located in contact with the middle layer, and a light-receiving layer that is epitaxially grown on the GaSb buffer layer and that has a type-II multiple quantum well structure. The GaSb buffer layer is epitaxially grown on the middle layer while exceeding a range of a normal lattice-matching condition.

8 Claims, 8 Drawing Sheets

(51) Int. Cl.
  *H01L 21/02* (2006.01)
  *H01L 31/0352* (2006.01)
  *H01L 31/103* (2006.01)
  *H01L 31/105* (2006.01)
  *H01L 27/144* (2006.01)
  *H01L 31/0304* (2006.01)
  *B82Y 20/00* (2011.01)

(52) U.S. Cl.
  CPC ... *H01L 21/02463* (2013.01); *H01L 21/02466* (2013.01); *H01L 21/02507* (2013.01); *H01L 21/02546* (2013.01); *H01L 21/02549* (2013.01); *H01L 27/1446* (2013.01); *H01L 27/1469* (2013.01); *H01L 27/14634* (2013.01); *H01L 27/14694* (2013.01); *H01L 31/03046* (2013.01); *H01L 31/035236* (2013.01); *H01L 31/103* (2013.01); *H01L 31/105* (2013.01)

(56) References Cited

U.S. PATENT DOCUMENTS

| | | | |
|---|---|---|---|
| 2007/0160100 A1* | 7/2007 | Huffaker et al. | 372/45.01 |
| 2009/0224229 A1* | 9/2009 | Razeghi | 257/21 |
| 2011/0204214 A1* | 8/2011 | Bahir et al. | 250/214.1 |
| 2012/0032145 A1 | 2/2012 | Nagai et al. | |
| 2013/0248821 A1 | 9/2013 | Miura et al. | |

FOREIGN PATENT DOCUMENTS

| | | | | |
|---|---|---|---|---|
| JP | 2003-173977 A | | 6/2003 | |
| JP | 2010-157667 A | | 7/2010 | |
| WO | PCT/US2009/052703 | * | 8/2009 | C08F 220/18 |

OTHER PUBLICATIONS

Kroemer H. et al., ("Physica E 20 (2004) 196-203—A family (InAs, GaSb, AlSb) and its hetcrostructures: a selective review", hereinafter Kroemer H.).*
Rubin Sidhu—A Long-Wavelength Photodiode on InP Using Lattice-Matched GaInAs—GaAsSb Type-II Quantum Wells; IEEE Photonics Technology Letters, vol. 17, No. 12, Dec. 2005.*
Hideto Takahashi et al., "The noble InGaAs photodiodes for near infrared detection," Optronics (1997), No. 3, pp. 107-113.
Binh-Minh Nguyen et al., "Very high quantum efficiency in type-II InAs/GaSb superlattice photodiode with cutoff of 12μm," Applied Physics Letters, 2007, vol. 90, 231108.
H.S. Kim et al., "Mid-IR focal plane array based on type-II InAs/GaSb strain layer superlattice detector with nBn design," Applied Physics Letters, 2008, vol. 92, 183502.
A. Braun et al., "Analytical solution to Matthews' and Blakeslee's critical dislocation formation thickness of epitaxially grown thin films," Journal of Crystal Growth 241 (2002) pp. 231-234.
Masayoshi Umeno et al., Handbook of Crystal Growth (edited by Hiroshi Komatsu, Kyoritsu Shuppan Co., Ltd., 1995) pp. 699.
International Search Report in PCT International Application No. PCT/JP2013/063668, dated Aug. 20, 2013.
Hideo Takahashi et al., "The noble InGaAs photodiodes for near infrared detection," Optronics (1997), No. 3, pp. 107-113.
Notification of First Office Action in Chinese Patent Application No. 201380003240.0, dated Jun. 30, 2015.
Extended European Search Report issued in European Patent Application No. 13796444.1 dated Apr. 7, 2015.
F. M. Mohammedy et al., "Growth and characterization of GaAsSb metamorphic samples on an InP substrate," Journal of Vacuum Science & Technology A 24(3), May/Jun. 2006, pp. 587-590.
H. Kroemer, "The 6.1 A family (InAs, GaSb, AlSb) and its heterostructures: a selective review," Physica E 20 (2004), pp. 196-203.
R. Sidhu et al., "A long-wavelength photodiode on InP using lattice-matched GaInAs—GaAsSb type-II quantum wells," IEEE Photonics Technology Letters, vol. 17, No. 12, Dec. 2005, pp. 2715-2717.
F. M. Mohammedy et al., "Growth and fabrication issues of GaSb-based detectors," J Mater Sci: Mater Electron (2009) 20: 1039-1058.

* cited by examiner

<GaSb BUFFER LAYER 2>
XRD: FWHM OF MAIN PEAK = 300 SECONDS OR LESS
MIRROR SURFACE, FLAT AND SMOOTH, NO FINE UNEVENNESS

LIGHT

| SYMBOL | STRUCTURE OF TEST SPECIMEN | ROOT MEAN SQUARE ROUGHNESS (Rms ROUGHNESS) |
|---|---|---|
| S1 |  | 2.34 Å |
| S2 | 　InGaAs MIDDLE LAYER | 1.11 Å |
| S3 | 　InGaAs MIDDLE LAYER | 10.0 Å |
| R1 |  | 11.2 Å |

LIGHT RECEIVING ELEMENT, SEMICONDUCTOR EPITAXIAL WAFER, DETECTING DEVICE, AND METHOD FOR MANUFACTURING LIGHT RECEIVING ELEMENT

TECHNICAL FIELD

The present invention relates to a light receiving element, a semiconductor epitaxial wafer, and a detecting device, all of which receive light in the near- to mid-infrared region, and a method for manufacturing the light receiving element.

BACKGROUND ART

Light in the near- to mid-infrared region corresponds to an absorption spectrum region related to biological objects such as plants and animals and the environment. Therefore, development of a photodetector in this wavelength region has been conducted. Light receiving elements that include a light-receiving layer composed of a group III-V compound semiconductor have become mainstream. For example, a known example of a detector includes a light receiving element array having a responsivity that is extended to a wavelength of 2.6 µm by using extended-InGaAs as a light-receiving layer (NPL 1). In the light receiving element array, InAsP that is lattice-matched with the InGaAs light-receiving layer is used as a window layer.

A light receiving element including a GaSb substrate and a light-receiving layer provided on the GaSb substrate, the light-receiving layer having a type-II (InAs/GaSb) multiple quantum well structure, has also been proposed (NPL 2). It is described that this light receiving element has a responsivity up to a wavelength of close to 12 µm.

A light receiving element having an n-B-n (n-type layer/barrier layer/n-type layer) structure has also been proposed in which a light-receiving layer having a type-II (InAs/GaSb) multiple quantum well structure is provided on a GaSb substrate and a barrier layer is disposed in the middle of the light-receiving layer (NPL 3). As compared with a light receiving element having a p-i-n structure, a light receiving element having the n-B-n structure has the following advantage: Since diffusion of a hole is used for detecting light, the depth of mesa etching for pixel isolation can be made shallow and a noise current flowing in a sidewall of a mesa structure can be reduced.

CITATION LIST

Non Patent Literature

NPL 1: Hideo Takahashi, et al., "InGaAs photodetector for near-infrared", OPTRONICS (1997), No. 3, pp. 107-113

NPL 2: Binh-Minh Nguyen, Darin Hoffman, Yajun Wei, Pierre-Yves Delaunay, Andrew Hood, and Manijeh Razeghi, "Very high quantum efficiency in type-II InAs/GaSb superlattice photodiode with cutoff of 12 µm" Appl. Phys. Lett., Vol. 90, 231108

NPL 3: H. S. Kim, E. Plis, J. B. Rodriguez, G. D. Bishop, Y. D. Sharma, L. R. Dawson, S. Krishna, J. Bundas, R. Cook, D. Burrows, R. Dennis, K. Patnaude, A. Reisinger, and M. Sundaram, "Mid-IR focal plane array based on type-II InAs/GaSb strain layer superlattice detector with nBn design" Appl. Phys. Lett., Vol. 92, 183502

DISCLOSURE OF INVENTION

Technical Problem

However, in the InGaAs photodetector (image sensor) for near-infrared described in NPL 1, the light-receiving layer is composed of InGaAs having a composition which is not lattice-matched with an InP substrate. Consequently, dark current of the photodetector increases, thereby increasing noise. In addition, it is difficult to realize a detectable wavelength of more than 2.6 µm.

The light receiving element described in NPL 2 has a problem in terms of mass productivity because the GaSb substrate is expensive and the quality of the substrate significantly varies. A particularly serious problem is that, since GaSb has light absorption due to a free carrier in the mid-infrared region, the responsivity is decreased in a structure in which light is incident from the rear surface of the GaSb substrate, the structure being necessary for arrayed pixels.

The light receiving element described in NPL 3 has the same problems as in NPL 2 and has difficulty in terms of mass productivity.

An object of the present invention is to provide a light receiving element, a semiconductor epitaxial wafer used for preparing the light receiving element, and a detecting device, all of which have a high responsivity over the near- to mid-infrared region and stably have a high quality while maintaining the economical efficiency, and a method for manufacturing the light receiving element.

Solution to Problem

A light receiving element according to the present invention is formed by using a group III-V compound semiconductor. The light receiving element includes an InP substrate that is transparent to light having a wavelength of 3 to 12 µm, a middle layer that is epitaxially grown on the InP substrate, a buffer layer located in contact with the middle layer, and a light-receiving layer that is epitaxially grown on the buffer layer and that includes a type-II multiple quantum well structure having a cutoff wavelength of 3 µm or more. The buffer layer is epitaxially grown on the middle layer while a value of $|a_1-a_0|/a_0$ is within a range of a normal lattice-matching condition, and values of $|a_2-a_1|/a_1$ and $|a_2-a_0|/a_0$ exceed the range of the normal lattice-matching condition, where $a_2$ represents a lattice constant of the buffer layer, $a_1$ represents a lattice constant of the middle layer, and $a_0$ represents a lattice constant of the InP substrate. The buffer layer is constituted by a GaSb layer.

In group III-V compound semiconductors, a lattice constant is changed by changing the composition of elements. Accordingly, in general, the composition of an epitaxial layer is finely changed such that a lattice constant of the epitaxial layer is matched with a lattice constant of an underlayer when the epitaxial layer is grown. Thus, a layered body of group III-V compound semiconductors having a low lattice defect density is formed, and dark current, which is one of the most important indices in a light receiving element, can be reduced. Reducing the lattice defect density is necessary in order to obtain characteristics of a certain level not only in light receiving elements but also in other semiconductor elements. In consideration of these circumstances specific to group III-V compound semiconductors or specific to compound semiconductors that are not limited to group III-V compound semiconductors, placing importance on a low lattice defect density is considered. In this case, in general, the degree of lattice mismatch $|s_1-s_2|/(s_2 \text{ or } s_1)$ where $s_1$ represents a lattice constant of an underlayer and $s_2$ represents a lattice constant of an upper layer that is epitaxially grown on the underlayer is preferably as small as possible. For example, in InGaAs/InP-based compound semiconductors, the degree of lattice mismatch is preferably (0.002 to 0.003) or less. It is generally known that the term "lattice matching" refers to a case where the degree of lattice mismatch is 0.005 or less. Considering these together, a range of a degree of lattice mismatch of 0.005 or less can be considered to be the range of the normal lattice-matching condition. That is, the phrase "exceeds a range of a normal lattice-matching condition" means that the degree of lattice mismatch exceeds 0.005.

However, in reality, a threshold value of the degree of lattice mismatch depends on the material system. Accordingly, in GaSb/InP, which are the focus of the present invention, a layered body of group III-V compound semiconductors having good crystal quality can be formed even when the degree of lattice mismatch is high. Under the lattice-matching condition determined by normally introducing only the lattice constants, whether or not an upper layer is epitaxially grown on an underlayer cannot be determined. The present invention is an invention which is based on demonstrated data and to which such an example exactly applies.

Herein, the reason why the phrase "the buffer layer is epitaxially grown on the middle layer" is used without using a phrase "the buffer layer is lattice-matched with the middle layer" is as follows. The term "lattice matching" may imply that a lattice constant of a growth layer and a lattice constant of a layer on which the growth layer is grown are close to each other. In order to avoid such misunderstanding, the phrase "epitaxially grown" is used. In other words, the phrase "epitaxially grown" refers to a case where a growth layer is grown on a layer at a low lattice defect density while maintaining "lattice matching" or "substantial lattice matching" even though a lattice constant of the growth layer is significantly different from a lattice constant of the layer on which the growth layer is grown.

According to the above structure, an InP substrate, which is known to have good crystal quality, is used, a middle layer is epitaxially grown on the InP substrate, and a buffer layer that does not match with a lattice-matching condition with respect to the middle layer and the InP substrate is epitaxially grown on the middle layer. A desired multiple quantum well structure (also abbreviated as "MQW") can then be epitaxially grown on the buffer layer. From the viewpoint of lattice constant, the multiple quantum well structure and the buffer layer are within a range of the lattice-matching condition.

The significance of the use of an InP substrate is as follows. Specifically, since the bandgap of InP is 1.35 eV, the InP substrate does not absorb light in a wavelength range to be received by the light-receiving layer having a cutoff wavelength of 3 μm. The bandgap of 1.35 eV corresponds to a short wavelength of a little less than 1 μm. Therefore, in a light receiving element including two-dimensionally arrayed pixels, on which light must be incident from the rear surface of the substrate, the target light is not absorbed by the substrate and thus a high responsivity can be maintained. In the case where a multiple quantum well structure having a cutoff wavelength of 3 μm or more is formed, a substrate composed of a group III-V compound semiconductor having a lattice constant larger than that of InP (lattice constant: 5.869 Å) is typically used even in the case of a type-II multiple quantum well structure. Even when the transition energy of an electron in light reception is reduced by using a type-II multiple quantum well structure, it is often assumed that a substrate having a lattice constant larger than that of InP is suitable in order to realize a long wavelength (small transition energy) of a cutoff wavelength of 3 μm. However, such a substrate having a lattice constant larger than that of an InP substrate absorbs light in the near- to mid-infrared region due to various factors including the large lattice constant. Since a substrate has a large thickness, the absorption of target light by the substrate causes a significant decrease in the responsivity.

By providing a buffer layer constituted by a GaSb layer on the middle layer grown on the InP substrate (hereinafter expressed as "InP substrate/middle layer"), and providing a light-receiving layer having a multiple quantum well structure having a cutoff wavelength of 3 μm or more as described above, a light receiving element having a high responsivity in the near- to mid-infrared region can be obtained. For the middle layer interposed between the InP substrate and the GaSb buffer layer, a material that planarizes a surface is selected. Although an InP substrate has good crystal quality as described above, the surface thereof is not sufficiently flat after an oxide film has been removed by heating, for example. By epitaxially growing a middle layer having good flatness, a surface having better flatness can be obtained. By epitaxially growing a GaSb buffer layer on the middle layer having good flatness, good crystal quality can be obtained in a light-receiving layer having a type-II multiple quantum well structure and disposed on the GaSb buffer layer. As a result, lower dark current can be realized.

An advantage of the use of the InP substrate/middle layer rather than a GaSb substrate is as follows: As described above, an InP substrate having good crystal quality can be stably obtained, and the middle layer has good flatness. Accordingly, even if the lattice defect density is transferred to an upper layer, significant degradation of the crystal quality or significant degradation of the flatness is suppressed. Therefore, a light-receiving layer having a multiple quantum well structure and having good crystal quality and good flatness can be stably obtained and dark current can be reduced. The stable, good crystal quality and flatness of the InP substrate/middle layer make characteristics of the resulting light receiving element uniform and improve the yield. Furthermore, it is possible to obtain a substrate having a larger diameter than the diameters of substrates composed of other group III-V compound semiconductors, and thus the use of the InP substrate/middle layer is good also in terms of mass productivity.

In the case where a multiple quantum well structure is formed by repeating a pair of an a layer and a b layer, the lattice constant of the MQW is determined from the periodicity of an X-ray diffraction (XRD) pattern. The lattice constant of a buffer layer is the average over the entire thickness of the buffer layer having a predetermined thickness and grown on an InP substrate, but is substantially the same as a lattice constant specific to the material, the lattice constant being described in a handbook or the like.

The buffer layer is constituted by a GaSb layer. Alternatively, the buffer layer may be constituted by a layer having the same crystal properties as a GaSb layer in terms of the relationship with an InP substrate/a middle layer (hereinafter, referred to as "a layer equivalent to a GaSb layer"). Herein, the phrase "having the same crystal properties as a GaSb layer in terms of the relationship with an InP substrate/a middle layer (hereinafter, referred to as "a layer equivalent to a GaSb layer")" means that the layer contains Sb, has a lattice constant substantially the same as that of a GaSb layer, and is epitaxially grown in the manner described above, though the degree of lattice mismatch with the InP substrate/middle layer deviates from the lattice-matching condition. The phrase further means that a light-receiving layer can be formed on the layer equivalent to a GaSb layer while lattice-matching with the layer equivalent to a GaSb layer.

Indium phosphide (InP) (lattice constant $a_0$=5.869 Å) is used as the substrate, and a group III-V compound semiconductor that is within the range of the lattice-matching condition with respect to InP is used as the middle layer. In this case, a light-receiving layer having a responsivity on the long-wavelength side can be epitaxially grown on the InP substrate/middle layer with a GaSb (lattice constant $a_2$=6.095 Å) layer or a layer equivalent to a GaSb layer therebetween, the GaSb layer or layer equivalent to a GaSb layer having a lattice constant significantly larger than the lattice constants of the InP substrate/middle layer. The thickness of the buffer layer is not particularly limited but is preferably 0.2 μm or more. When the thickness of the buffer layer is less than 0.2 μm, the following problem occurs. Specifically, in the case where a ground electrode is formed in a buffer layer, when epitaxial layers are etched from an upper layer to a position corresponding to a predetermined thickness of the buffer layer, it is necessary to stop the etching within the buffer layer. When the thickness of the buffer layer is less than 0.2 μm, the etching stop position is not located within a range of variation in the etching stop. The upper limit of the thickness of the buffer layer is 1 μm or more, and preferably 1.5 μm or more or 2 μm or more because the crystal quality of the surface layer can be made good when the buffer layer has a larger thickness within a predetermined range.

From the standpoint of the relationship with a critical film thickness in the middle layer (which is assumed to have a lattice constant substantially the same as that of InP)/GaSb buffer layer, a thickness of the buffer layer of 0.2 μm or more is significantly larger than the critical film thickness, which will be described in detail in embodiments below. When the degree of lattice mismatch is 0.038, the critical film thickness is estimated to be about 4 nm (0.004 μm) at most. Accordingly, the thickness of the buffer layer is several tens times or more the critical film thickness. The GaSb buffer layer has a thickness at least 50 times or more the critical film thickness. The thickness of the GaSb buffer layer may be 100 times or more the critical film thickness. It is believed that this is because specific properties such as a surfactant effect of Sb are also related.

From the standpoint of lattice matching, the InP substrate/middle layer/buffer layer constituted by a GaSb layer or a layer equivalent to a GaSb layer is considered to function as an alternative to a GaSb substrate. However, in the case where a GaSb substrate is used, the GaSb substrate absorbs light targeted by the light-receiving layer because GaSb has light absorption due to a free carrier in the mid-infrared region. Since the substrate has a large thickness, the absorption of target light by the GaSb substrate causes a significant decrease in the responsivity. As described above, since an InP substrate does not absorb light having a wavelength of 3 μm or more, a good responsivity can be maintained.

Since an InP substrate stably has good crystal quality compared with a GaSb substrate, characteristics of the resulting light receiving element can be made uniform and the yield can be improved. An InP substrate is good in terms of mass productivity because it is possible to obtain an InP substrate having a larger diameter than that of a GaSb substrate. Furthermore, an InP substrate is very inexpensive, and thus a high-quality light receiving element having high economical efficiency can be provided.

As described above, when the middle layer is provided, the flatness of an epitaxial layer stacked on the middle layer can be improved by good flatness of the middle layer. For example, a root mean square roughness (Rms roughness) of a surface of the middle layer can be made ⅗ or less of the Rms roughness of a surface of an InP substrate. As for the GaSb buffer layer whose surface flatness is not good and is desired to be improved, the flatness is improved by stacking the GaSb buffer layer so as to be in contact with the middle layer. Also in such a case, comparing the Rms roughness of the middle layer with that of the GaSb buffer layer in terms of relative values, for example, the Rms roughness of a surface of the middle layer is about ⅕ or less of the Rms roughness of a surface of the GaSb buffer layer.

In the case where a layer is epitaxially grown on an InP substrate, usually, an oxide layer is removed by performing heat treatment. In this step, although a fresh InP substrate surface is revealed, the flatness of the surface is slightly degraded. A group III-V compound semiconductor having good flatness is selected as the material of the middle layer. Since the middle layer has a surface with good flatness, the GaSb buffer layer that is epitaxially grown on this middle layer can also have good flatness. This good flatness is transferred to the light-receiving layer having a type-II multiple quantum well structure, and thus a light-receiving layer having a multiple quantum well structure and good flatness can be obtained. Accordingly, dark current can be reduced.

The middle layer is preferably an InGaAs layer or a GaAsSb layer.

A middle layer having good flatness can be formed by employing an existing method, for which various technologies have been developed.

This good flatness is transferred to the GaSb buffer layer and the light-receiving layer having a type-II multiple quantum well structure. The lattice constant of an InGaAs middle layer or a GaAsSb middle layer can be made the same as that of InP by adjusting the composition.

The middle layer preferably has a thickness of 50 nm or more.

When the middle layer has a thickness of 50 nm or more, it is possible to reliably recover the flatness of a surface degraded when an oxide film or the like on the InP substrate is removed by heating, and to exhibit the flatness of the middle layer.

The InP substrate that is transparent to light having a wavelength of 3 to 12 μm is preferably an InP substrate to which sulfur (S) is not added.

The transmittance of an InP substrate containing sulfur (S) decreases from a wavelength of 3 μm or more, becomes close to almost zero at a wavelength of 5 μm, and becomes zero at a wavelength of 5 μm or more. For this reason, a sulfur-free InP substrate is used as the InP substrate.

The InP substrate that is transparent to light having a wavelength of 3 to 12 μm is particularly preferably an Fe-containing InP substrate or an undoped InP substrate.

When an Fe-containing InP substrate or an undoped InP substrate is used, the InP substrate is transparent to light having a wavelength of 3 to 12 μm, thus enhancing the responsivity of the light receiving element of the present invention, which receives light in this wavelength range.

The light-receiving layer may have a p-n junction therein.

With this structure, it is possible to provide a light receiving element for the infrared region, the light receiving element having a high responsivity and a p-i-n structure.

Alternatively, the light-receiving layer may include an insertion layer that is composed of a group III-V compound semiconductor and that is lattice-matched with the light-receiving layer, and a bottom of a conduction band of the insertion layer may be higher than a bottom of a conduction band of the light-receiving layer.

With this structure, it is possible to provide a light receiving element for the infrared region, the light receiving element having a high responsivity and an n-B-n (n-type layer/barrier layer/n-type layer) structure. In addition, the leak current can be reduced while reliably achieving the independence of pixels.

The multiple quantum well structure in the light-receiving layer of the light receiving element may be any of {(InAs/GaSb), (InAs/InGaSb), (InAsSb/GaSb), and (InAsSb/InGaSb)} which are type-II multiple quantum well structures.

With this structure, the light receiving element can include a light-receiving layer having a responsivity in the near- to mid-infrared region (at a wavelength of 3 to 12 μm). Note that the lattice constant of InAs is 6.058 Å, the lattice constant of GaSb is 6.095 Å, the lattice constant of $In_{0.2}Ga_{0.8}Sb$ is 6.172 Å, and the lattice constant of $InAs_{0.92}Sb_{0.08}$ is 6.092 Å.

The light receiving element may have a structure in which light is incident from a rear surface of the InP substrate.

With this structure in which the rear surface of the InP substrate functions as an incident surface, it is possible to obtain a hybrid detecting device whose size is reduced by connecting two-dimensionally arrayed light receiving elements (pixels) to read-out electrodes of a read-out integrated circuit (ROIC) by a micro-bump bonding method so as to have a compact structure. In other words, such a compact, user-friendly hybrid detecting device cannot be obtained without using the micro-bump bonding method. Furthermore, since the InP substrate does not absorb light in the near- to mid-infrared region, a light receiving element having a high responsivity in this wavelength range can be obtained.

Herein, for example, an anti-reflection (AR) film provided on the rear surface of the substrate corresponds to the structure in which light is incident from the substrate side. Two-dimensionally arrayed pixels (included in a light receiving element) also correspond to this structure because such two-dimensionally arrayed pixels are arranged on the assumption that light is incident from the rear surface of the substrate.

A detecting device according to the present invention includes any of the light receiving elements described above, and a read-out integrated circuit (ROIC). In the detecting device, a pixel electrode in the light receiving element is connected to a read-out electrode in the ROIC with a bump interposed therebetween.

With this structure, it is possible to obtain a compact and downsized detecting device having a high responsivity in the near- to mid-infrared region.

A semiconductor epitaxial wafer according to the present invention is formed by using a group III-V compound semiconductor. The semiconductor epitaxial wafer includes an InP substrate that is transparent to light having a wavelength of 3 to 12 μm, a middle layer that is epitaxially grown on the InP substrate, a GaSb buffer layer located in contact with the middle layer, and a light-receiving layer that is epitaxially grown on the GaSb buffer layer and that has a type-II multiple quantum well structure. The GaSb buffer layer is epitaxially grown on the middle layer while a value of $|a_1-a_0|/a_0$ is within a range of a normal lattice-matching condition, and values of $|a_2-a_1|/a_1$ and $|a_2-a_0|/a_0$ exceed the range of the normal lattice-matching condition, where $a_2$ represents a lattice constant of the buffer layer, $a_1$ represents a lattice constant of the middle layer, and $a_0$ represents a lattice constant of the InP substrate.

Regarding epitaxial growth, the normal lattice-matching condition, etc. in group III-V compound semiconductors, the description in the light receiving element applies as it is. The technical significance of the buffer layer constituted by a GaSb layer is also the same as described above. The technical significance of the buffer layer constituted by a layer equivalent to a GaSb layer is also the same as described above.

With the above structure, an InP substrate, which is known to have good crystal quality, and a middle layer are used, and a buffer layer having a lattice constant that is believed not to be lattice-matched with InP is formed as a GaSb layer or the like, and thus the crystal quality of the buffer layer can be made to be relatively good. An epitaxial layer that is lattice-matched with the buffer layer can be grown on this semiconductor epitaxial wafer. In a sense, a substrate having a lattice constant different from InP can be realized while the InP substrate/middle layer are used.

In the semiconductor epitaxial wafer, the middle layer is preferably an InGaAs layer or a GaAsSb layer.

Since a middle layer having good flatness is formed, the flatness of the GaSb buffer layer and the flatness of the type-II multiple quantum well structure can be made good.

In the epitaxial wafer, the InP substrate that is transparent to light having a wavelength of 3 to 12 μm may be an Fe-containing InP substrate or an undoped InP substrate.

With this structure, a substrate having a large thickness does not absorb light having a wavelength in the range of 3 to 12 μm. Thus, the responsivity of the light receiving element according to the present invention, which receives light in this wavelength range, can be enhanced.

In the semiconductor epitaxial wafer, the multiple quantum well structure may be any of {(InAs/GaSb), (InAs/InGaSb), (InAsSb/GaSb), and (InAsSb/InGaSb)} which are type-II multiple quantum well structures.

With this structure, a semiconductor epitaxial wafer for preparing a light receiving element having a high responsivity in the near- to mid-infrared region (at a wavelength of 3 to 12 μm) can be provided.

A method for manufacturing a light receiving element according to the present invention is a method for manufacturing a light receiving element in which a group III-V compound semiconductor is stacked. The method includes the steps of preparing an InP substrate that is transparent to light having a wavelength of 3 to 12 μm, epitaxially growing a middle layer on the InP substrate, epitaxially growing a GaSb buffer layer on the middle layer, and forming, on the GaSb buffer layer, a light-receiving layer including a type-II multiple quantum well structure having a cutoff wavelength of 3 μm or more. The multiple quantum well structure is any of {(InAs/GaSb), (InAs/InGaSb), (InAsSb/GaSb), and (InAsSb/InGaSb)} which are type-II multiple quantum well structures.

According to the above method, by using a GaSb layer or the like, which is considered to be a material that is not lattice-matched with the InP substrate/middle layer from the standpoint of common sense, it is possible to form a buffer layer having good crystal quality to such an extent that a multiple quantum well structure can be epitaxially grown on the buffer layer. As a result, a light receiving element having a high responsivity at a wavelength of 3 μm or more can be obtained for the reason described above. In addition, an InP substrate which has a large diameter and which stably have good crystal quality is available, and thus a high-quality light receiving element having good economical efficiency can be provided. Note that, as described above, the buffer layer may be constituted by a layer equivalent to a GaSb layer.

In the method for manufacturing a light receiving element, an InGaAs layer or a GaAsSb layer is preferably grown as the middle layer.

In this case, a GaSb buffer layer and a type-II multiple quantum well structure that have good flatness can be obtained.

Advantageous Effects of Invention

According to the light receiving element etc. of the present invention, a high responsivity is obtained in the near- to mid-infrared region and a high quality is stably obtained while maintaining economical efficiency. In particular, since an InP substrate is used as a substrate, light absorption does not occur in the above wavelength region and a good responsivity can be obtained. Furthermore, high mass productivity can be achieved by using an InP substrate having a large diameter.

REFERENCE SIGNS LIST

1 InP substrate, 2 GaSb buffer layer, 3 light-receiving layer, 5 n-type contact layer, 6 n-type region, 9 bump of light receiving element, 10 light receiving element, 11 pixel electrode, 12 ground electrode, 12e wiring electrode, 15 p-n junction, 21 n$^+$-type MQW, 22 n-type MQW, 23 barrier layer, 24 n$^+$-type MQW, 35 anti-reflection film, 36 selective diffusion mask pattern, 43 protective film, 50 hybrid detecting device, 55 p-type contact layer, 70 read-out integrated circuit, 71 read-out electrode, 72 ground electrode, 73 insulating film, 79 bump, 101 InP (100) substrate doped with Fe, and P pixel.

DESCRIPTION OF EMBODIMENTS (Embodiment 1)

Figure 1A:
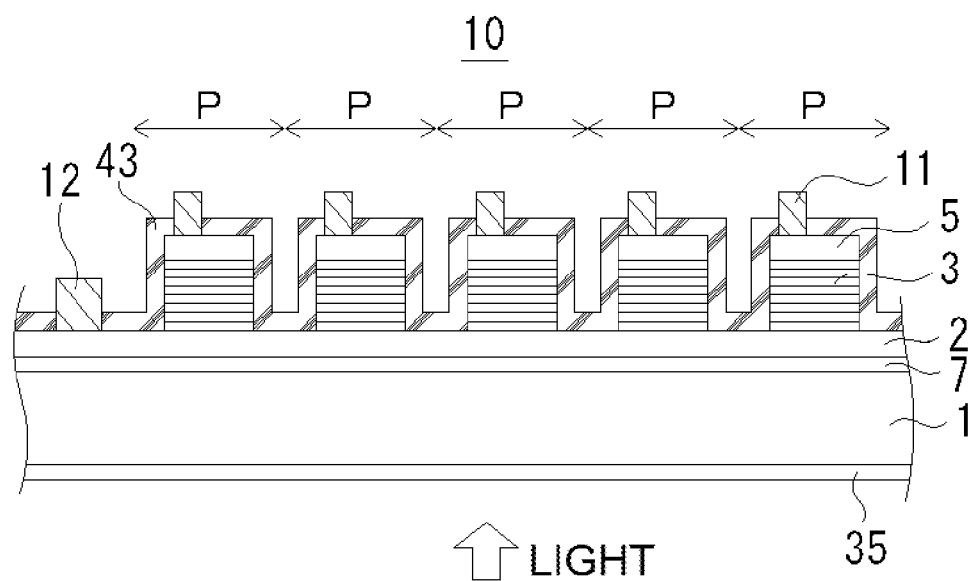
FIG. 1A shows a light receiving element according to Embodiment 1 of the present invention, and is a view showing a light receiving element including two-dimensionally arrayed pixels.
Figure 1B:
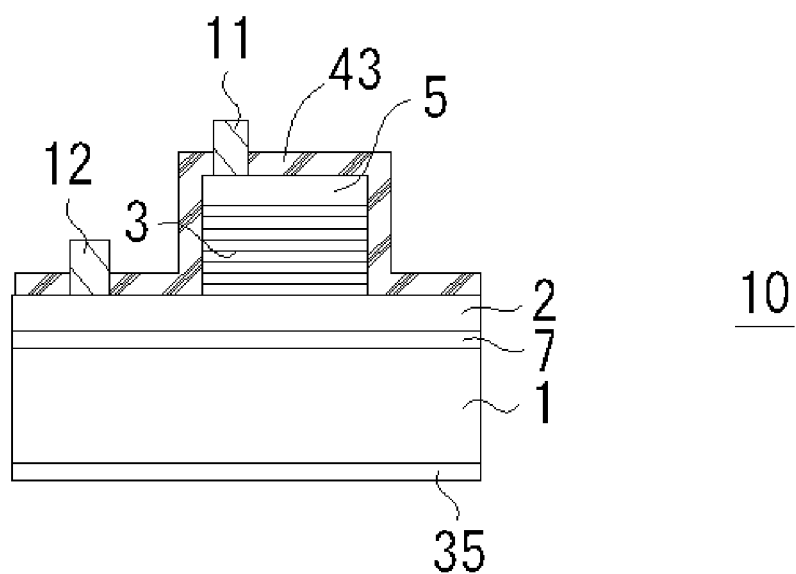
FIG. 1B shows a light receiving element according to Embodiment 1 of the present invention, and is a view showing a light receiving element including a single pixel.

FIGS. 1A and 1B are views each showing a light receiving element 10 according to Embodiment 1 of the present invention. FIG. 1A is a view showing a light receiving element in which pixels are two-dimensionally arrayed. FIG. 1B is a view showing a light receiving element including a single pixel. These light receiving elements are each a light receiving element of the present invention. A description of the light receiving element including two-dimensionally arrayed pixels covers a description of the light receiving element including a single pixel. Therefore, a description will now be made of the light receiving element including two-dimensionally arrayed pixels.

Referring to FIG. 1A, the light receiving element 10 includes the following group III-V semiconductor layered structure:

<InP substrate 1/InGaAs middle layer 7/p-type GaSb buffer layer 2/type-II (InAs/GaSb) multiple quantum well structure (MQW)/n-type contact layer 5>

Among these, the type-II (InAs/GaSb) MQW functions as a light-receiving layer 3. The MQW has a cutoff wavelength of 3 µm or more and has a responsivity to light (having, for example, a wavelength of 3 to 12 µm) in the near- to mid-infrared region. Regarding this MQW, for example, a unit of (InAs/GaSb) constitutes one pair, and about 100 to 300 pairs of (InAs/GaSb) are preferably formed. The thicknesses of InAs and GaSb layers may be in the range of 1.5 to 7 nm, for example, the thickness of an InAs layer may be 3.6 nm and the thickness of a GaSb layer may be 2.1 nm. Among the layers constituting the MQW, GaSb layers forming several tens of pairs on the InP substrate 1 side are preferably doped with a p-type impurity such as beryllium (Be). Among the layers constituting the MQW, InAs layers forming several tens of pairs on the contact layer 5 side are preferably doped with an n-type impurity such as Si so that the several tens of pairs on the contact layer 5 side become n-type layers. Intermediate layers between the several tens of pairs on the InP substrate 1 side and the several tens of pairs on the contact layer 5 side are not doped with an impurity so that the intermediate layers become i-type (intrinsic-type) layers. By forming these conductivity-type regions in the MQW, a p-i-n photodiode can be produced. The independence of respective pixels P is ensured by grooves of a mesa structure.

A p-n junction or a p-i-n junction is formed in the MQW 3 by the doping or undoping of an impurity.

An electrode 11 of a pixel P is preferably composed of, for example, an AuGeNi alloy so as to establish ohmic contact with the n-type contact layer 5. A ground electrode 12 is preferably composed of, for example, a Ti/Pt/Au alloy so as to establish ohmic contact with the p-type GaSb buffer layer 2. In this structure, the buffer layer preferably has a carrier concentration of 1E18 cm$^{-3}$ or more.

Light is incident from the rear surface of the InP substrate 1. An anti-reflection (AR) film 35 covers the rear surface of the InP substrate 1 in order to prevent the incident light from being reflected. This structure in which the AR film 35 is arranged on the rear surface of the InP substrate 1 is a structure for allowing light to be incident from the substrate side. Furthermore, since a micro-bump bonding method used for connecting to a read-out integrated circuit is employed in the two-dimensional array of the pixels P, it is necessary that light be incident from the substrate side. Accordingly, this two-dimensional array of the pixels P is also the structure for allowing light to be incident from the substrate side.

Features in the present embodiment lie in the following points.

(1) The lattice constant $a_0$ of the InP substrate 1 is 5.869 Å, and the lattice constant $a_1$ of the InGaAs middle layer 7 is made to be the same as the lattice constant $a_0$ of the InP substrate by adjusting the composition. In contrast, the lattice constant $a_2$ of GaSb is 6.095 Å, which is very large. The degree of lattice mismatch between the InGaAs middle layer 7 and GaSb is determined as follows: $|a_2-a_1|/$ $a_1 = 0.038$ (3.8%) Although the difference in the lattice constant between the underlayer and the upper layer is very large, the GaSb buffer layer 2 is epitaxially grown on the InGaAs middle layer 7 while having relatively good crystal quality. The reason for this is not clear at present. On the basis of comprehensive consideration of the results of previous studies etc., it is believed that a large thickness of the GaSb buffer layer and a specific property such as a surfactant effect of Sb are also related to such good crystal quality.

In general, the larger the degree of lattice mismatch, the smaller the thickness of a layer to be grown must be because the number of misfit dislocations increases and an epitaxial film having good crystal quality cannot be obtained. Therefore, in the field of crystal growth, the concept of a critical film thickness is provided, and it is generally believed that an epitaxial film having good crystal quality cannot be obtained when the epitaxial film has a film thickness equal to or larger than the critical film thickness. The critical film thickness is determined by the Matthews-Blakeslee equation based on a mechanical equilibrium theory (for example, A. Braun et al., Journal of Crystal Growth 241 (2002) pp. 231-234) or the People-Bean equation based on an energy equilibrium theory. A graph showing the relationship between the critical film thickness and the degree of lattice mismatch on the basis of these formulae is shown in "Masayoshi Umeno and Tetsuo Soga, Handbook of Crystal Growth (edited by Hiroshi Komatsu, Kyoritsu Shuppan Co., Ltd., 1995), p. 699". In InP/GaSb, the degree of lattice mismatch is 0.038 as described above. Referring to the graph of the Handbook of Crystal Growth, in this case, the critical film thickness is about 4 nm (0.004 μm) on the basis of the People-Bean equation, and about 1 nm (0.001 μm) on the basis of the Matthews-Blakeslee equation.

As described above, the thickness of the GaSb buffer layer 2 is preferably 0.2 μm or more. Accordingly, in the present embodiment, the thickness of the GaSb buffer layer 2 is several tens times or more the critical film thickness. Even on the basis of a critical film thickness of about 4 nm determined by the People-Bean equation, by which the critical film thickness is calculated as a large value, the thickness of the GaSb buffer layer 2 is 50 times or more the critical film thickness. The thickness of the GaSb buffer layer 2 may be 100 times or more the critical film thickness.

(2) The reason why the InGaAs middle layer 7 is provided is as follows. The InP substrate 1 has good crystal quality and has a surface with good flatness. However, when the InP substrate 1 is heat-treated in a film deposition chamber in order to remove an oxide film or the like, the oxide film on a surface is removed and the flatness of the surface is degraded, thereby increasing the roughness. It has been confirmed that a GaSb buffer layer can be epitaxially grown directly thereon. However, by epitaxially grown the InGaAs middle layer 7 on the InP substrate 1 which has been heat-treated for the purpose of removing an oxide film, a surface of the InGaAs middle layer 7, the surface having good flatness, can be obtained. By epitaxially grown the GaSb buffer layer 2 on this InGaAs middle layer 7, the roughness of a surface of the GaSb buffer layer 2 is reduced and thus a GaSb buffer layer having good flatness can be obtained. When a type-II (InAs/GaSb) MQW is grown on this GaSb buffer layer 2, a multiple quantum well structure having good flatness can also be obtained. As described above, since several hundred monolayers each having a thickness of about 1.5 to 5 nm are stacked, the flatness of a surface is very important in order to obtain a multiple quantum well structure having good crystal quality. The smaller the thickness of the monolayer in the multiple quantum well structure, the more important the flatness becomes. As described above, in the case where the thickness of the monolayer is 1.5 nm, a desired multiple quantum well structure cannot be formed unless the flatness is good.

Examples of the criterion for measuring the flatness include an Rms roughness and a surface unevenness profile measured with an atomic force microscope or the like. The correlation with crystal quality is observed by using any criterion. However, it was found that the unevenness profile of a surface has a good correlation with crystal quality or dark current, though this criterion is not satisfactory in terms of numerical quantitative determination.

The GaSb buffer layer 2 grown on the InGaAs middle layer 7 has a mirror surface, does not have unevenness on a surface thereof, and is flat. Regarding the GaSb buffer layer 2, the full width at half maximum (FWHM) of a main diffraction peak in XRD is preferably 300 seconds or less. In order to reliably realize the ohmic contact, the p-type GaSb buffer layer 2 has a carrier concentration of $1E18 \text{ cm}^{-3}$ or more.

(3) The InP substrate 1 has a bandgap energy of 1.35 eV. This bandgap corresponds to a wavelength of a little less than 1 μm. Therefore, the InP substrate 1 does not absorb light to be received by the light-receiving layer 3.

Figure 2:
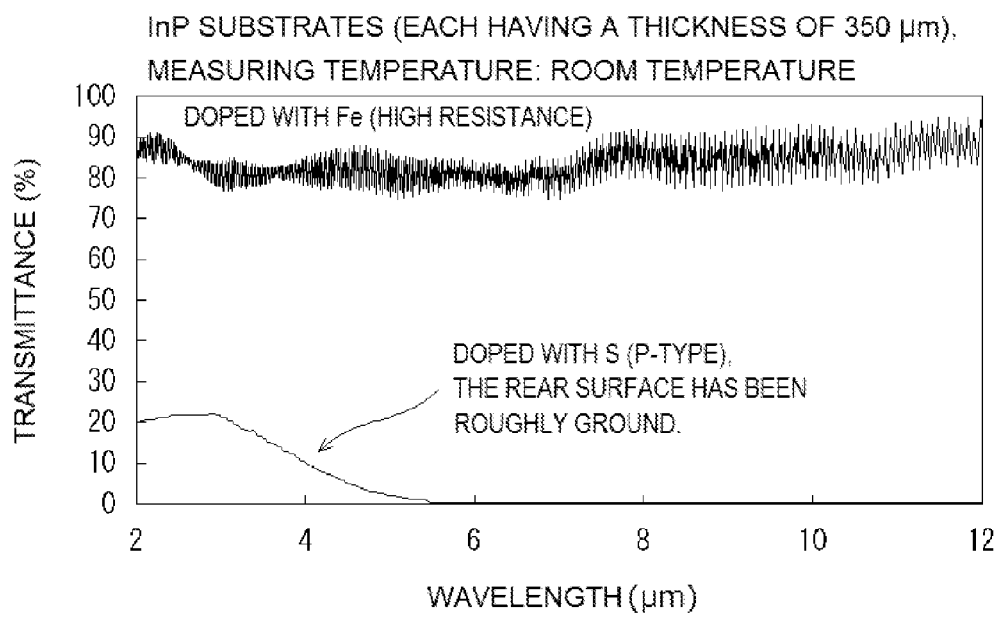
FIG. 2 is a chart showing the transmittance of InP substrates.

FIG. 2 is a chart showing the results of the transmittance of InP substrates each having a thickness of 350 μm, the transmittance being measured (at room temperature) with a Fourier transform infrared spectrophotometer (FT-IR). A (high-resistance) InP substrate doped with Fe is transparent in the range of a wavelength of 2 to 12 μm and does not have an absorption band in this range. FIG. 2 also shows the transmittance of an InP substrate doped with sulfur. The transmittance of this InP substrate doped with sulfur is almost zero at a wavelength of 5 μm or more. A low transmittance at a wavelength of less than 5 μm is due to the influence of rough grinding of the rear surface of the substrate. Since the transmittance is zero at a wavelength of 5 μm or more, the sulfur-containing InP substrate cannot be used as a substrate of a light receiving element for the infrared region that is targeted by the present invention.

In the case where a type-II MQW having a cutoff wavelength of 3 μm or more is formed, in general, a group III-V compound semiconductor having a lattice constant larger than that of InP is used as the material that forms layers of the MQW. When a group III-V compound semiconductor that is lattice-matched with InP is used, a cutoff wavelength of 3 μm or more cannot be realized even in the case where the difference in transition energy of an electron in light reception is reduced by using a type-II MQW. Since the InGaAs middle layer 7 in FIGS. 1A and 1B is latticed-matched with the InP substrate, the bandgap of the InGaAs middle layer 7 is not so small that the InGaAs middle layer 7 absorbs light that is received by a type-II MQW. Thus, it may be assumed that the InGaAs middle layer 7 is equivalent to the InP substrate 1 with respect to light in the near- to mid-infrared region.

Figure 3:
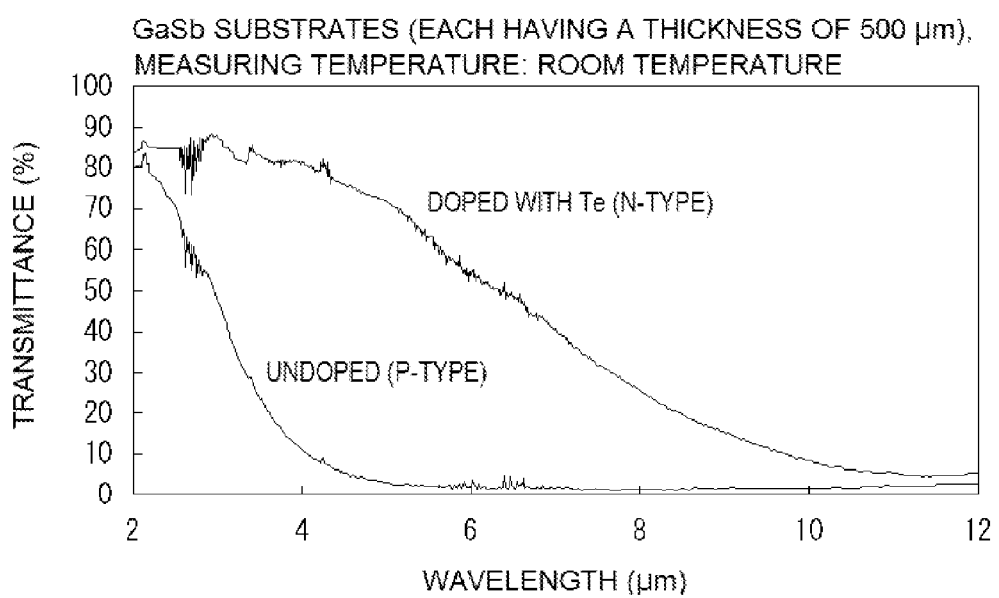
FIG. 3 is a chart showing the transmittance of GaSb substrates.

In the case where a cutoff wavelength of 3 μm or more is realized by using a type-II MQW, for example, a GaSb substrate is usually used. A group III-V compound semiconductor having a large lattice constant, such as GaSb, often has an absorption band in a wavelength range of the near- to mid-infrared region. For example, GaSb has absorption due to a free carrier in the mid-infrared region, as shown in FIG. 3. FIG. 3 is a chart showing the results of the transmittance of GaSb substrates each having a thickness of 500 μm, the transmittance being measured (at room temperature) with an FT-IR. Referring to FIG. 3, regarding an undoped GaSb substrate, the transmittance is almost zero at a wavelength of 5 µm or more. Similarly, regarding a GaSb substrate doped with Te, the substrate having a transmittance slightly higher than that of the undoped GaSb substrate, the transmittance gradually decreases from about 70% at a wavelength of about 5 µm, becomes about 50% at a wavelength of about 6.5 µm, and decreases to 25% or less at a wavelength of 8 µm or more. It is difficult to use the GaSb substrate showing the above-described transmittance in a light receiving element that targets the infrared region. After an epitaxial wafer is produced, for example, it is necessary to remove the GaSb substrate or to significantly reduce the thickness of the GaSb substrate. In such a case, the number of steps is increased and the quality is degraded.

However, according to the above structure, the GaSb buffer layer 2 having good crystal quality can be grown on the InP substrate 1/InGaAs middle layer 7, the InGaAs middle layer 7 and the InP substrate 1 having no absorption band in the near- to mid-infrared region, and the type-II (InAs/GaSb) MQW having a cutoff wavelength of 3 µm or more is formed as a light-receiving layer on the GaSb buffer layer 2. Consequently, the InGaAs middle layer 7, the InP substrate 1 having a large thickness do not absorb target light. As a result, the responsivity to target light can be improved.

(4) An InP substrate having good crystal quality can be stably obtained, compared with a GaSb substrate.

Therefore, even when a layered body constituted by InP substrate 1/InGaAs middle layer 7/GaSb buffer layer 2/light-receiving layer 3 having an (InAs/GaSb) MQW is formed by epitaxial growth, a light-receiving layer 3 having an (InAs/GaSb) MQW and having good crystal quality can be obtained at any position and in any occasion. As a result, an element having uniform characteristics can be produced with a high yield.

Furthermore, an InP substrate is good in terms of mass productivity because a substrate having a large diameter can be obtained compared with a GaSb substrate. Furthermore, an InP substrate is more inexpensive than a GaSb substrate. Thus, a light receiving element 10, and furthermore, a detecting device 50 that are good in terms of economical efficiency can be provided.

Figure 4:
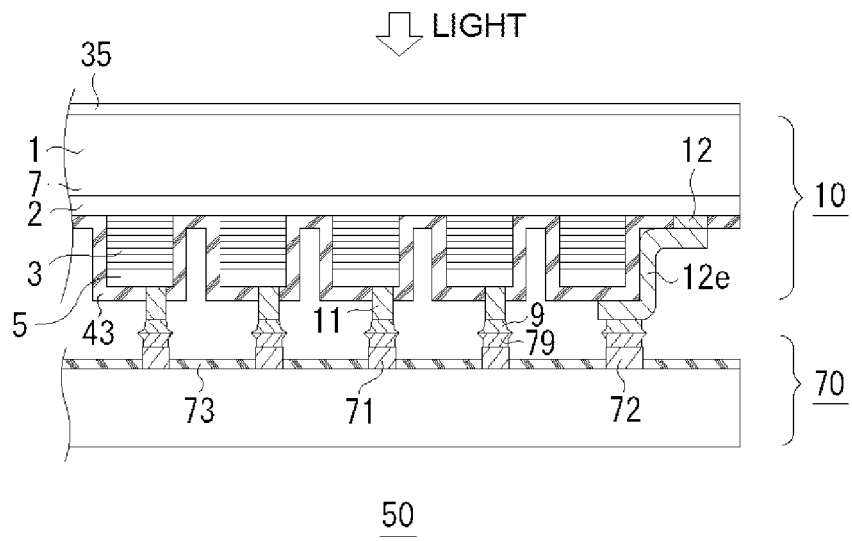
FIG. 4 is a cross-sectional view showing a hybrid detecting device that combines the light receiving element shown in FIG. 1A and a read-out integrated circuit.

FIG. 4 is a view showing a hybrid detecting device in which the light receiving element 10 shown in FIG. 1 is connected to a read-out integrated circuit 70 formed on silicon (Si). The read-out integrated circuit 70 is a complementary metal-oxide semiconductor (CMOS). A pixel electrode 11 that is electrically connected to an n-type contact layer 5 is electrically connected to a read-out electrode 71 with a bump 9 of the pixel electrode 11 and a bump 79 of the read-out electrode 71, the bumps 9 and 79 being interposed between the pixel electrode 11 and the read-out electrode 71. A ground electrode 12 that is electrically connected to a p-type buffer layer 2 is electrically connected to a wiring electrode 12e that extends along a protective film 43 and that has the same height as the height of the pixel electrode 11. The wiring electrode 12e is electrically connected to a ground electrode 72 of the CMOS with bumps interposed therebetween.

According to the above-described connection through a bump, the connection being established by the micro-bump bonding method, a compact and downsized detecting device can be obtained even when a pixel pitch is reduced so that pixels are arranged at a high density.

Figure 5:
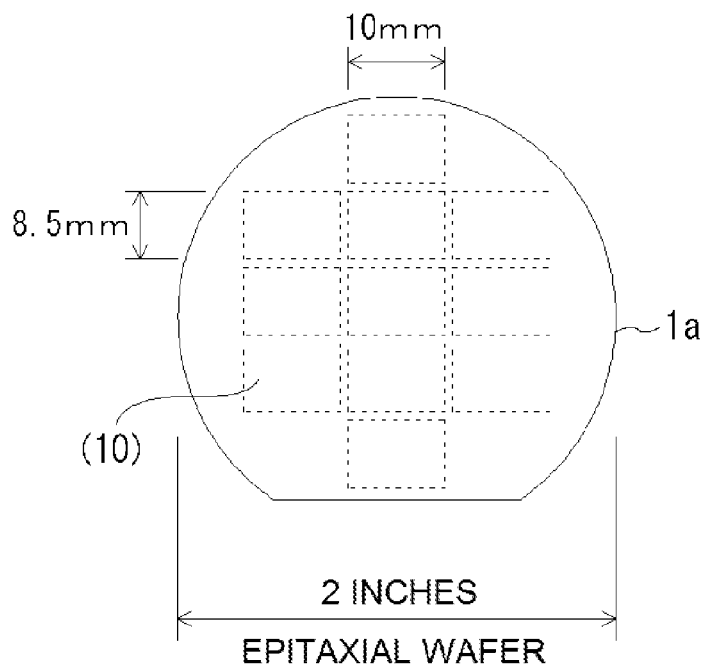
FIG. 5 is a view showing a semiconductor epitaxial wafer of the present invention.

FIG. 5 is a plan view showing a semiconductor epitaxial wafer 1a in the course of preparation of the light receiving element 10 shown in FIG. 1. In the case of a chip (light receiving element) which has a size of 8.5 mm×10 mm and in which about 80,000 pixels are arranged in the vertical direction and the horizontal direction with a 30 µm pitch, about 11 chips can be obtained from an InP substrate having a diameter of 2 inches, though it depends on the specification of the light receiving element 10. About 52 chips can be obtained from an InP substrate having a diameter of 4 inches. As described above, high mass production efficiency can be achieved by using an InP substrate having a large diameter, compared with the case where a GaSb substrate is used.

The semiconductor epitaxial wafer 1a shown in FIG. 5 is in a state where a GaSb buffer layer 2 is grown on the InP substrate 1/InGaAs middle layer 7. The GaSb buffer layer 2 has a thickness of 1 µm or more, has a mirror surface, does not have unevenness on a surface thereof, and is flat. In addition, the FWHM of a main peak in XRD is 300 seconds or less. However, $|a_2 - a_1|/a_1$=about 0.038 (3.8%). It is believed that this good crystal quality is due to the fact that the GaSb buffer layer has a large thickness and that the buffer layer contains Sb.

The light receiving element 10 is cut from the semiconductor epitaxial wafer 1a into pieces in a state where a light-receiving layer 3, a contact layer 5, a mesa structure, and electrodes 11 and 12 are formed thereon and the outlines of the chips substantially become clear. FIG. 5 is a view showing a state where the GaSb buffer layer 2 is formed.

Figure 6:
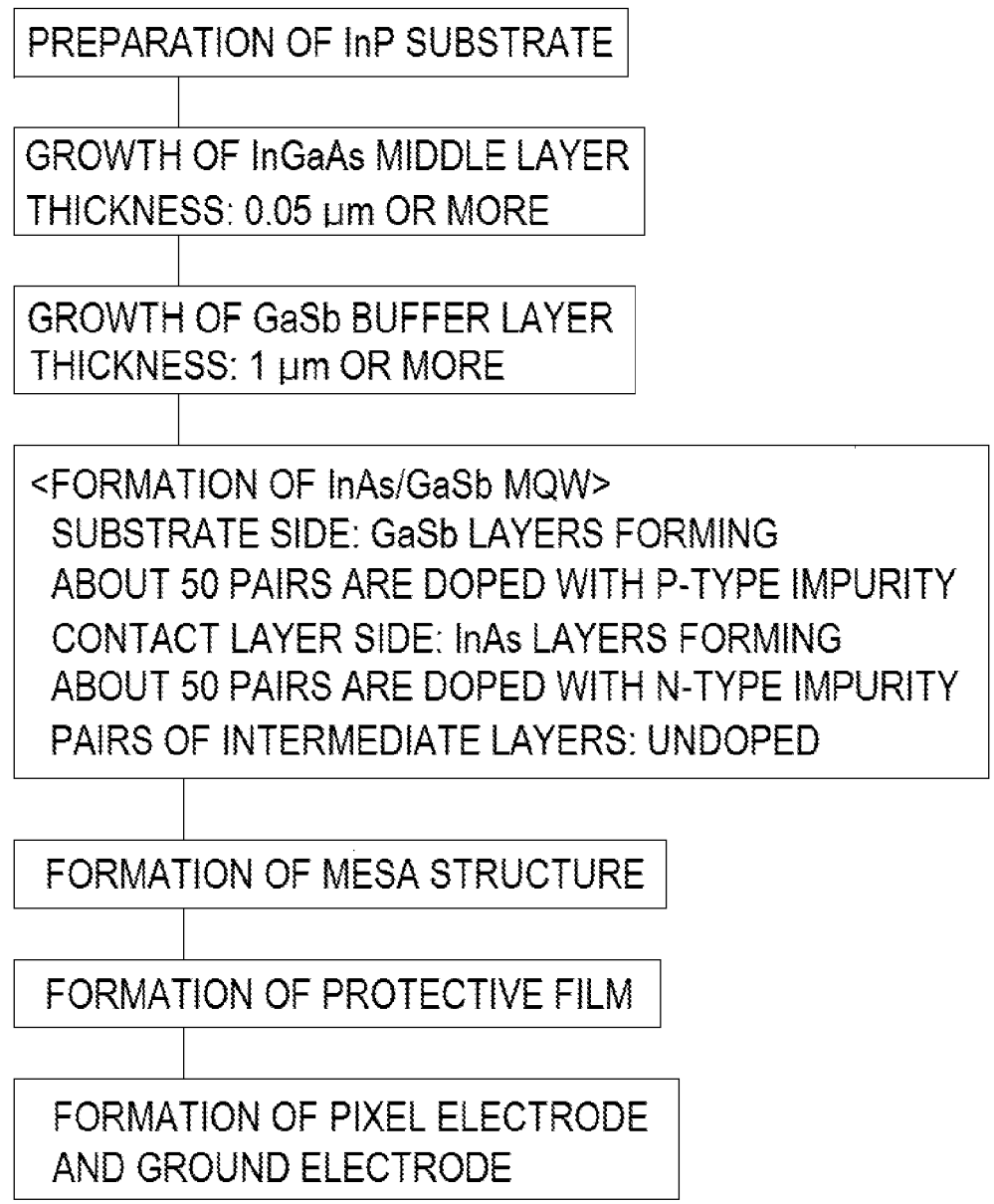
FIG. 6 is a flowchart of a method for manufacturing the light receiving element shown in FIG. 1A.

FIG. 6 is a flowchart showing a method for manufacturing the light receiving element 10 shown in FIG. 1. First, an InP substrate is prepared. The InP substrate is heated while being irradiated with a molecular beam of arsenic (As) to remove an oxide film. An InGaAs middle layer 7 is then epitaxially grown on the InP substrate. The composition of the InGaAs middle layer 7 is adjusted so that the lattice constant thereof becomes the same as the lattice constant of the InP substrate. The InGaAs middle layer 7 is epitaxially grown so as to have a thickness of 0.05 µm or more, for example, about 0.15 µm. A GaSb buffer layer 2 is grown on the InGaAs middle layer 7 so as to have a thickness of 1 µm or more. The growing method is not particularly limited. For example, a molecular beam epitaxy (MBE) method or a metal organic vapor phase epitaxy (MOVPE) method can be employed. After the GaSb buffer layer 2 is grown, a light-receiving layer 3 having a type-II (InAs/GaSb) MQW is grown. Since the transition (light reception) of type-II is conducted through the interface between InAs and GaSb, the responsivity on the long-wavelength side is increased with an increase in the number of interfaces. Therefore, in the case where the responsivity on the long-wavelength side is important, the MQW preferably includes about 150 pairs or more in total. In order to form a p-n junction in the light-receiving layer 3, i.e., in the MQW, GaSb layers forming about 50 pairs of the MQW on the side close to the InP substrate 1 are doped with Be, which is a p-type impurity, during the growth of the MQW. The MQW formed thereafter is undoped so as to function as an intrinsic (i-type) semiconductor. Subsequently, InAs layers forming the last about 50 pairs of the MQW are doped with Si, which is an n-type impurity. Thus, a p-i-n type or n-i-p type photodiode can be obtained. The p-i-n junction is also a type of p-n junction. In some structures, only a p-i junction may be present in the light-receiving layer. However, when a region with which an electrode comes in contact is also considered, the p-i junction is considered to be a p-i-n junction. This p-i-n junction can also be interpreted as a p-n junction located in the light-receiving layer.

Next, a mesa structure in which a trench is provided between pixels P is formed by etching. The etching is conducted by wet etching using phosphoric acid, hydrogen peroxide water, and water or by dry etching using hydrogen iodide or silicon chloride gas. Consequently, each pixel P becomes independent from the surrounding pixels, thereby preventing crosstalk etc. Next, as shown in FIG. 1, the surface of the mesa structure is covered with a protective film (passivation film) 43 that protects the surface. For example, a $SiO_2$ film is preferably used as the protective film (passivation film) 43.

Subsequently, a pixel electrode 11 and a ground electrode 12 are formed by photolithography.

In the light receiving element 10 described above, the light-receiving layer 3 having a type-II (InAs/GaSb) MQW and having a cutoff wavelength of 3 μm or more is provided on the GaSb buffer layer 2 on the InP substrate 1/InGaAs middle layer 7. Accordingly, even in the case where light is incident from the rear surface of the substrate, the responsivity can be increased because the InP substrate 1 having a large thickness does not absorb light having a target wavelength.

By using the InP substrate and the InGaAs middle layer 7, which have good crystal quality, as the underlying base of the GaSb buffer layer 2, a GaSb buffer layer 2 having good crystal quality can be obtained, though the reason for this is not exactly clear. As a result, the light-receiving layer 3 having a type-II (InAs/GaSb) MQW having a low lattice defect density can be obtained, and dark current of the light receiving element can be reduced.

Furthermore, since the InP substrate 1 is more inexpensive than a GaSb substrate, it is possible to provide a light receiving element and a detecting device that are good in terms of economical efficiency.

(Embodiment 2)

Figure 7:
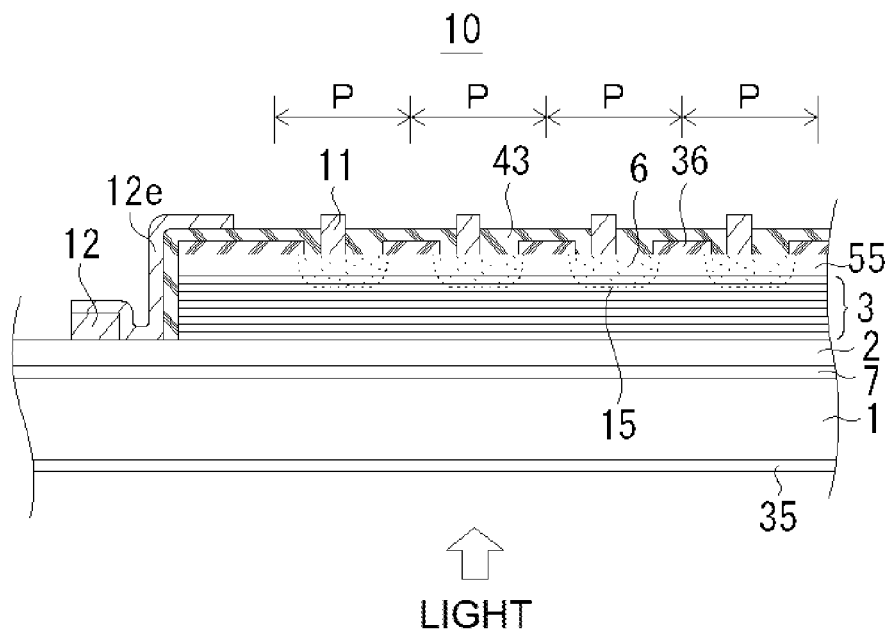
FIG. 7 is a cross-sectional view showing a light receiving element according to Embodiment 2 of the present invention.

FIG. 7 is a cross-sectional view showing a light receiving element 10 according to Embodiment 2 of the present invention. In this light receiving element 10, pixels P each include, as main portions, an n-type region 6 formed by selective diffusion from an opening of a SiN selective diffusion mask pattern 36, and a p-n junction 15 located on an end of the n-type region 6. The p-n junction 15 reaches the inside of a light-receiving layer 3. As described above, the p-n junction 15 may be a p-i junction. Each of the pixels P is isolated from surrounding pixels by a region that is not subjected to the selective diffusion.

The layered body of group III-V compound semiconductors has a structure constituted by <InP substrate 1/InGaAs middle layer 7/p-type GaSb buffer layer 2/light-receiving layer 3 having type-II (InAs/GaSb) MQW/p-type contact layer 55>. In the present embodiment, a region with which a pixel electrode 11 comes in contact is the n-type region 6 in which an n-type impurity is selectively diffused. The pixels P are isolated from each other by a region that is not subjected to the selective diffusion and crystal layers maintain the states as they are. Accordingly, unlike a mesa structure, sidewalls of the pixels are not exposed, and thus crystals are not easily damaged. As a result, low dark current is easily realized.

Regarding other structures and operations, the description in Embodiment 1 applies to the present embodiment as it is.

(Embodiment 3)

Figure 8A:
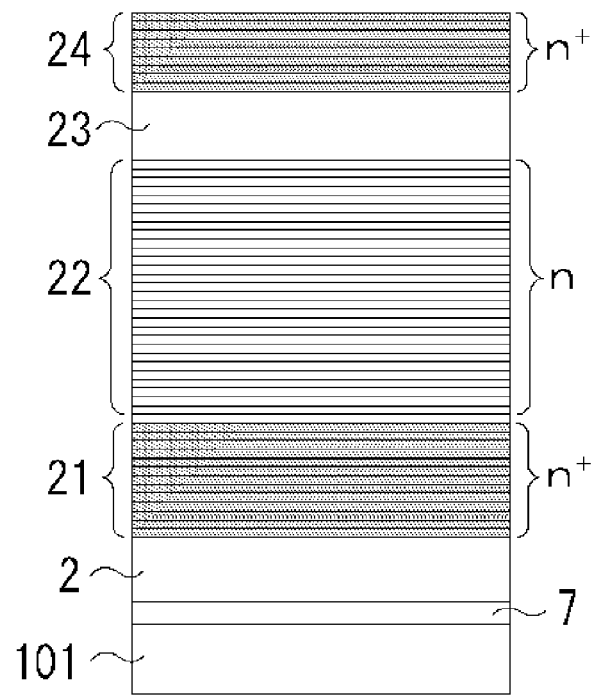
FIG. 8A shows an epitaxial wafer according to Embodiment 3 of the present invention.
Figure 8B:
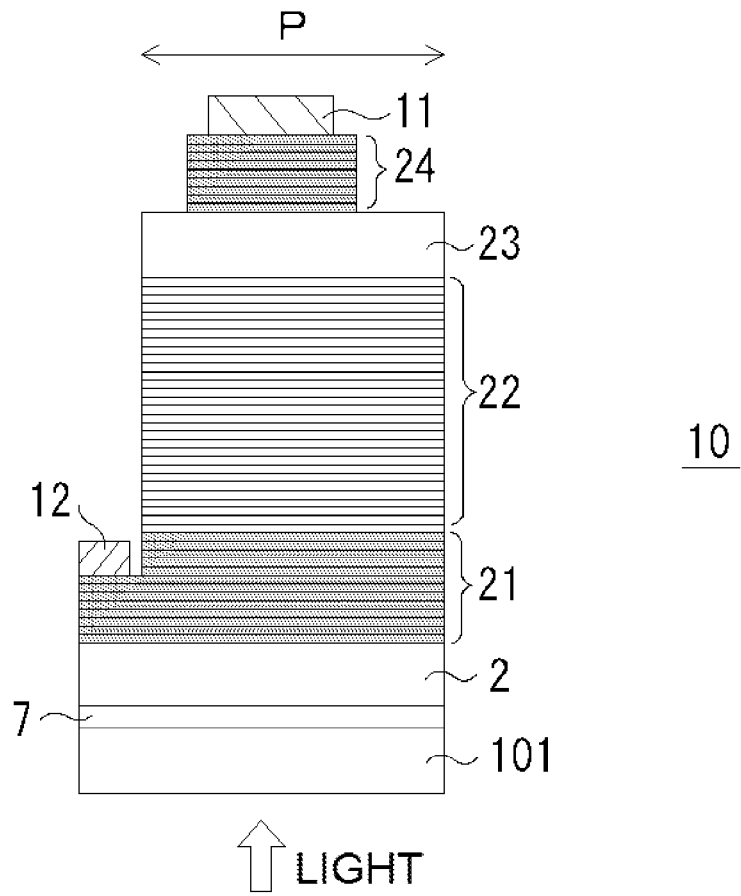
FIG. 8B shows a light receiving element according to Embodiment 3 of the present invention.

FIG. 8A is a cross-sectional view showing an epitaxial wafer according to Embodiment 3 of the present invention, and FIG. 8B is a cross-sectional view showing a light receiving element 10 according to Embodiment 3 of the present invention. The semiconductor epitaxial wafer shown in FIG. 8A has the following layered structure. <InP (100) substrate 101 doped with Fe/InGaAs middle layer 7/GaSb buffer layer 2 doped with Te/light-receiving layer having $n^+$-type MQW 21 composed of (InAs/GaSb)/light-receiving layer having n-type MQW 22 composed of (InAs/GaSb)/barrier layer 23 having bottom of conduction band higher than those of the MQWs disposed thereon and thereunder/contact layer having $n^+$-type MQW 24 composed of (InAs/GaSb)>

Out of the $n^+$-type MQW 21 and the n-type MQW 22 that form a light-receiving layer, the $n^+$-type MQW 21 including several tens of pairs, for example, 60 pairs and located on the side adjacent to the buffer layer 2 is an n-type, and has an n-type carrier concentration of $2E18$ $cm^{-3}$ or more. In this case, InAs is doped with silicon (Si), which is an n-type impurity, and GaSb is not doped. The n-type MQW 22 composed of (InAs/GaSb) and located on the $n^+$-type MQW 21 includes, for example, 100 pairs and has an n-type carrier concentration of $1E16$ $cm^{-3}$. This n-type carrier concentration of $1E16$ $cm^{-3}$ in the n-type MQW 22 can be realized without intentionally introducing an n-type impurity.

The barrier layer 23 has a wide bandgap and may be composed of AlGaSb, AlAsSb, or the like having a bottom of a conduction band higher than bottoms of conduction bands of the MQWs disposed thereon and thereunder. The barrier layer 23 is usually a single layer but may have an MQW. In the case of a single layer, preferably, the barrier layer 23 is composed of $Al_{0.2}Ga_{0.8}Sb$ and has a thickness of about 100 nm.

A contact layer on which a pixel electrode 11 is to be arranged includes, for example, 20 pairs and is the $n^+$-type MQW 24 having a carrier concentration of $2E18$ $cm^{-3}$ or more. Also in this case, InAs is doped with silicon (Si), which is an n-type impurity, and GaSb is not doped.

In the light receiving element 10 shown in FIG. 8B, only the contact layer constituted by the $n^+$-type MQW 24 or the contact layer and a portion of the barrier layer are mesa-etched, thereby isolating a pixel P from a peripheral portion. Although not shown in the figure, in the case where the pixels are arrayed, only the contact layer constituted by the $n^+$-type MQW 24 is mesa-etched, thereby isolating the pixels from adjacent pixels. A pixel electrode 11 is composed of a Ti/Pt/Au alloy or the like so as to establish ohmic contact with the n-type contact layer constituted by the $n^+$-type MQW 24. A ground electrode 12 is preferably composed of a Ti/Pt/Au alloy or the like so as to establish ohmic contact with the $n^+$-type MQW 21 located to be in contact with the buffer layer 2. In the present embodiment, the pixel electrode 11 and the ground electrode 12 are each an n-side electrode.

In the light receiving element 10 according to the present embodiment, among electron-hole pairs generated by light reception, a hole that diffuses and reaches a pixel electrode is captured, thereby detecting the light reception. Since the movement of a hole to the pixel electrode is caused by diffusion, the depth of a trench of a mesa structure that isolates pixels can be reduced. As a result, a noise current flowing in a sidewall of the mesa structure can be suppressed to be low.

In order to produce a detecting device, surfaces are covered with an AR film, a protective film, etc., as in Embodiment 1. Furthermore, the pixel electrode 11 is electrically connected to a read-out electrode of an ROIC with bumps interposed therebetween. Ground electrodes are also electrically connected to each other.

In the present embodiment, advantages etc. achieved by providing the GaSb buffer layer 2 on the InP substrate 1/InGaAs middle layer 7 are common to those in Embodiments 1 and 2.

EXAMPLES

The semiconductor epitaxial wafer 1a (before the formation of the light-receiving layer 3) shown in FIG. 5 was prepared and tests were conducted. A method for preparing the semiconductor epitaxial wafer of a present invention example is as follows.

<Test Specimen>:

An InP substrate 1 was charged in a film deposition chamber used in the MBE method. The InP substrate 1 was heated while being irradiated with an arsenic (As) molecular beam to remove an oxide film. An InGaAs middle layer 7, the composition of which was adjusted so that a lattice constant of the middle layer 7 was the same as that of InP, was epitaxially grown on the InP substrate 1 by the MBE method so as to have a thickness of 0.15 μm. Subsequently, a GaSb buffer layer was grown by the MBE method. The GaSb buffer layer was grown at a ratio V/III of 3.9 and at a substrate temperature of 400° C. so as to have a thickness of 2 μm. The growth rate was 1.1 μm/hour (about 1 ML/sec). For the semiconductor epitaxial wafer prepared by the method described above, a measurement of a surface roughness (root mean square roughness (Rms roughness)) and an analysis of a cross-sectional profile were performed. The measurement and the analysis were performed by using an atomic force microscope in accordance with JISB0651, JISB0601, etc.

In order to examine the function of the InGaAs middle layer 7, the following test specimens in the course of manufacturing were also prepared and the measurement was performed using the test specimens.

(S1): An InP substrate 1 immediately before the growth of an InGaAs middle layer 7, that is, after heating for removing an oxide film (S2): An InP substrate 1 after an InGaAs middle layer 7 was grown on the InP substrate 1

(S3): An InP substrate 1 after an InGaAs middle layer 7 was grown on the InP substrate 1 and a GaSb buffer layer 2 was then grown on the InGaAs middle layer 7

Figure 9:
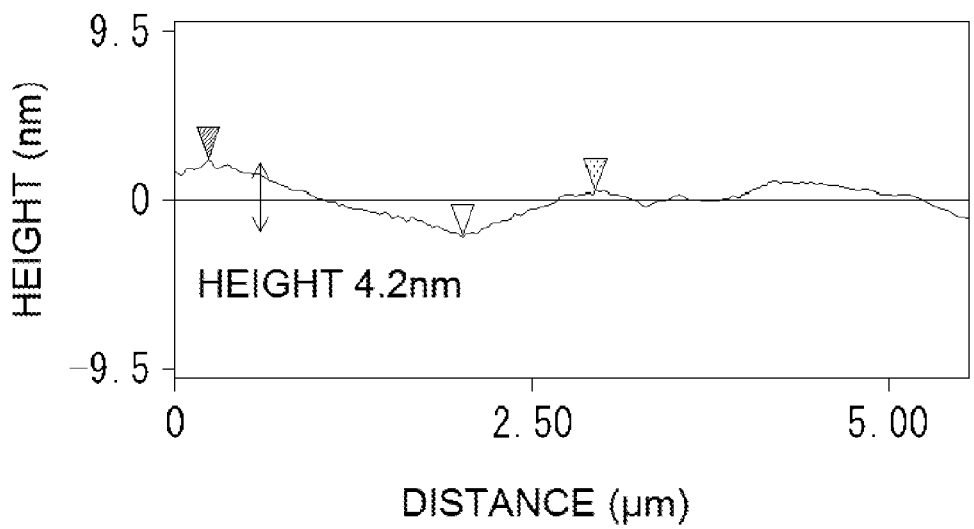
FIG. 9 is a chart showing an unevenness profile of a GaSb buffer layer of test specimen S3 in Examples.
Figure 10:
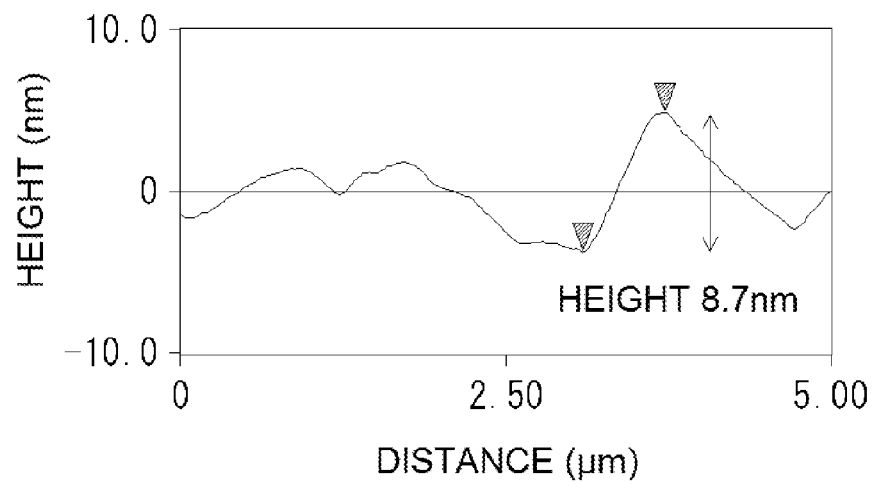
FIG. 10 is a chart showing an unevenness profile of a GaSb buffer layer of test specimen R1 described as a reference example in Examples.

(R1): An InP substrate 1 after a GaSb buffer layer 2 was grown directly on the InP substrate 1, which is a test specimen for reference <Cross-sectional Profile>:

FIG. 9 is a chart showing an unevenness profile of a surface a GaSb buffer layer of the test specimen (S3). Specifically, FIG. 9 shows the flatness of a surface of a GaSb buffer layer 2 in a structure constituted by InP substrate 1/InGaAs middle layer 7/GaSb buffer layer 2. FIG. 10 is a chart showing an unevenness profile of a surface when a GaSb buffer layer was grown directly on an InP substrate 1 in the test specimen (R1) of a reference example. Comparing FIG. 9 with FIG. 10, the surface profile in FIG. 9, in which the InGaAs middle layer 7 was provided, clearly shows that the size of unevenness of the surface is small and has good flatness, as compared with the surface profile in FIG. 10. Accordingly, a function of the InGaAs middle layer 7 is to improve the flatness of the GaSb buffer layer 2, which is epitaxially grown on the InGaAs middle layer 7.

Figure 11A:
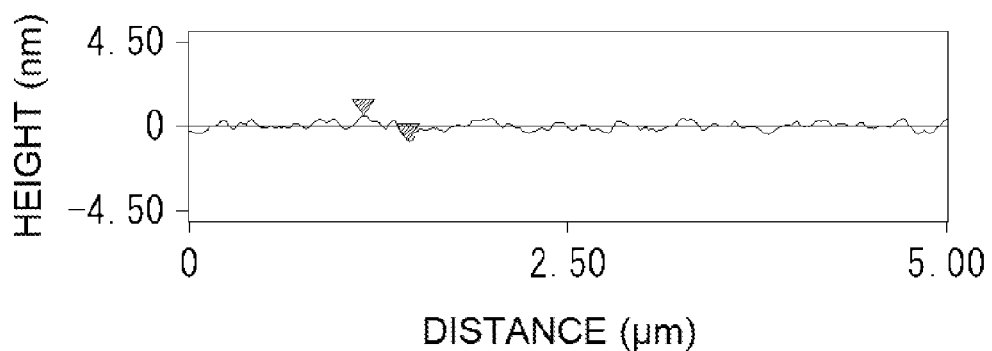
FIG. 11A is a chart showing an unevenness profile of test specimen S1 (InP substrate) in Examples.
Figure 11B:
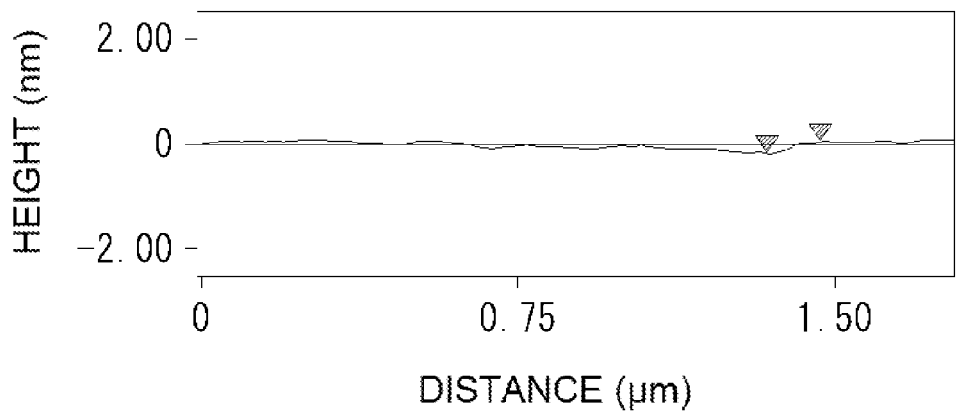
FIG. 11B is a chart showing an unevenness profile of an InGaAs middle layer in Examples.

FIGS. 11A and 11B are views each showing a surface profile in the course of the preparation of the test specimen (S3) shown in FIG. 9. FIG. 11A shows a surface profile of an InP substrate 1 of the test specimen (S1) after heat treatment was performed for the purpose of removing an oxide film. FIG. 11B shows a surface profile of an InGaAs middle layer 7 that was epitaxially grown on an InP substrate 1. The sensitivity related to height (unevenness) represented by the vertical scale of FIG. 11A is less than half of that of FIG. 11B. Although the measurement sensitivity shown in FIG. 11A is low, the height of the unevenness shown in FIG. 11A is substantially the same as or slightly higher than the height of the unevenness shown in FIG. 11B. After the InGaAs middle layer was epitaxially grown on the InP substrate 1, the unevenness of the InGaAs middle layer 7 was smoothed out and the flatness was clearly improved.

Accordingly, in the case where a GaSb buffer layer is grown on the InP substrate 1/InGaAs middle layer 7, a GaSb buffer layer having good flatness can be obtained compared with the case where the GaSb buffer layer 2 is grown directly on the InP substrate 1. The crystal quality of a multiple quantum well structure including several tens to several hundreds of pairs of layers and formed on the GaSb buffer layer 2 is significantly affected by the flatness of the underlying base. As described above, the smaller the thickness of a monolayer in a multiple quantum well structure, the more important the flatness becomes. By using the InGaAs middle layer 7, an improved, good crystal quality can be obtained in a type-II multiple quantum well structure that constitutes a light-receiving layer, and low dark current can be realized.

Figure 12:
FIG. 12 is a table showing measurement results of a root mean square roughness of a surface roughness in Examples.
Figure 12:
Figure 12:
Figure 12:

<Root Mean Square Roughness (Rms Roughness)>:

The results are shown in FIG. 12. The root mean square roughness shows substantially the same tendency as that of unevenness profiles of the cross-sectional profiles shown in FIGS. 9, 10, 11A, and 11B. When an InGaAs middle layer 7 is grown on an InP substrate 1, the root mean square roughness becomes half or less. As a result, in the case where a GaSb buffer layer is grown on the InP substrate 1/InGaAs middle layer 7, the root mean square roughness of the GaSb buffer layer becomes small compared with the case where the GaSb buffer layer 2 is grown directly on the InP substrate 1. However, the difference in the numerical value of the root mean square roughness is reduced because it is believed that the root mean square roughness is averaged as compared with the raw unevenness profiles in the cross-sectional profiles.

According to the semiconductor epitaxial wafer 1a including the InGaAs middle layer 7, a light-receiving layer having a type-II MQW and having a large lattice constant can be grown so as to be in contact with the GaSb buffer layer 2 which has good flatness, though the lattice constant is large. This light-receiving layer has a cutoff wavelength of 3 μm or more, and the InP substrate does not absorb light in this wavelength range. In contrast, in the case where a GaSb substrate is used, the GaSb substrate has an absorption band due to a free carrier in the above wavelength range. Since the substrate has a large thickness, this absorption causes a significant decrease in the responsivity. By using the InP substrate/InGaAs middle layer as in the present invention example, the problem of the absorption by a substrate is avoided, and a high responsivity can be maintained at a wavelength of 3 μm or more.

Embodiments and Examples of the present invention have been described above. The embodiments and Examples of the present invention disclosed above are only illustrative, and the scope of the present invention is not limited to these embodiments of the invention. It is to be understood that the scope of the present invention is defined by the description of Claims and includes the equivalents of the description in Claims and all modifications within the scope of Claims.

INDUSTRIAL APPLICABILITY

According to the light receiving element etc. of the present invention, a high responsivity can be maintained over the near- to mid-infrared region. Furthermore, since an InP substrate, which has a stable quality, which can have a large diameter, and which is good in terms of economical efficiency, is used as a substrate, a high-quality light receiving element etc. can be provided at a low cost.

The invention claimed is:

1. A light receiving element formed by using a group III-V compound semiconductor, the light receiving element comprising:

an InP substrate that is transparent to light having a wavelength of 3 to 12 μm;
a middle layer that is epitaxially grown on the InP substrate;
a buffer layer located in contact with the middle layer; and
a light-receiving layer that is epitaxially grown on the buffer layer and that includes a type-II multiple quantum well structure having a cutoff wavelength of 3 μm or more,
wherein the buffer layer is epitaxially grown on the middle layer while a value of $|a_1-a_0|/a_0$ is within a range of a normal lattice-matching condition, and values of $|a_2-a_1|/a_1$ and $|a_2-a_0|/a_0$ exceed the range of the normal lattice-matching condition, where $a_2$ represents a lattice constant of the buffer layer, $a_1$ represents a lattice constant of the middle layer, and $a_0$ represents a lattice constant of the InP substrate; and the buffer layer is constituted by a GaSb layer,
wherein both of the III-group and V-group elements of the buffer layer are different from those of the InP substrate; and
the middle layer is an InGaAs layer or a GaAsSb layer.

2. The light receiving element according to claim 1, wherein the middle layer has a thickness of 50 nm or more.

3. The light receiving element according to claim 1, wherein the light-receiving layer has a p-n junction therein.

4. The light receiving element according to claim 1, wherein the light-receiving layer includes an insertion layer that is composed of a group III-V compound semiconductor and that is lattice-matched with the light-receiving layer, and a bottom of a conduction band of the insertion layer is higher than a bottom of a conduction band of the light-receiving layer.

5. The light receiving element according to claim 1, wherein the multiple quantum well structure is any of {(InAs/GaSb), (InAs/InGaSb), (InAsSb/GaSb), and (InAsSb/InGaSb)} which are type-II multiple quantum well structures.

6. A detecting device comprising the light receiving element according to claim 1; and a read-out integrated circuit (ROIC), wherein a pixel electrode in the light receiving element is connected to a read-out electrode in the ROIC with a bump interposed therebetween.

7. A semiconductor epitaxial wafer formed by using a group III-V compound semiconductor, the semiconductor epitaxial wafer comprising:
an InP substrate that is transparent to light having a wavelength of 3 to 12 μm;
a middle layer that is epitaxially grown on the InP substrate;
a GaSb buffer layer located in contact with the middle layer; and
a light-receiving layer that is epitaxially grown on the GaSb buffer layer and that has a type-II multiple quantum well structure,
wherein the GaSb buffer layer is epitaxially grown on the middle layer while a value $|a_1-a_0|/a_0$ is within a range of a normal lattice-matching condition, and values of $|a_2-a_1|/a_1$ and $|a_2-a_0|/a_0$ exceed the range of the normal lattice-matching condition, where $a_2$ represents a lattice constant of the buffer layer, $a_1$ represents a lattice constant of the middle layer, and $a_0$ represents a lattice constant of the InP substrate,
wherein both of the III-group and V-group elements of the GaSb buffer layer are different from those of the InP substrate; and
the middle layer is an InGaAs layer or a GaAsSb layer.

8. A method for manufacturing a light receiving element in which a group III-V compound semiconductor is stacked, the method comprising the steps of:
preparing an InP substrate that is transparent to light having a wavelength of 3 to 12 μm;
epitaxially growing an InGaAs layer or a GaAsSb layer as a middle layer on the InP substrate;
epitaxially growing a GaSb buffer layer on the middle layer; and
forming, on the GaSb buffer layer, a light-receiving layer including a type-II multiple quantum well structure having a cutoff wavelength of 3 μm or more,
wherein the multiple quantum well structure is any of {(InAs/GaSb), (InAs/InGaSb), (InAsSb/GaSb), and (InAsSb/InGaSb)} which are type-II multiple quantum well structures,
wherein both of the III-group and V-group elements of the GaSb buffer layer are different from those of the InP substrate.

* * * * *